US011353338B2

(12) United States Patent
Elliott et al.

(10) Patent No.: US 11,353,338 B2
(45) Date of Patent: Jun. 7, 2022

(54) INDUCTIVE SENSOR MODULE ASSEMBLY WITH A CENTER SIGNAL PROCESSOR

(71) Applicant: KSR IP Holdings, LLC, Wilmington, DE (US)

(72) Inventors: Ryan W. Elliott, Thamesville (CA); James Kent Hartford, Blenheim (CA); Buri Sen, London (CA)

(73) Assignee: KSR IP HOLDINGS, LLC, Wilmington, DE (US)

(*) Notice: Subject to any disclaimer, the term of this patent is extended or adjusted under 35 U.S.C. 154(b) by 204 days.

(21) Appl. No.: 15/999,070

(22) Filed: Aug. 17, 2018

(65) Prior Publication Data
US 2019/0056244 A1 Feb. 21, 2019

Related U.S. Application Data

(60) Provisional application No. 62/548,053, filed on Aug. 21, 2017.

(51) Int. Cl.
*G01D 5/20* (2006.01)
*G01R 33/00* (2006.01)
(Continued)

(52) U.S. Cl.
CPC ....... *G01D 5/2053* (2013.01); *G01R 33/0047* (2013.01); *H01F 27/2804* (2013.01); *H05K 1/165* (2013.01); *H05K 2201/09027* (2013.01)

(58) Field of Classification Search
CPC ........ G01D 5/142; G01D 5/145; G01D 5/147; G01D 5/20; G01D 5/202; G01D 5/204; G01D 5/2053; G01D 5/206; G01D 5/22; G01D 5/2225; G01D 5/225; G01D 5/2275; G01D 5/2283; G01D 5/2291; G01R 33/0047; H01F 27/2804; H05K 1/165; G01B 7/30
See application file for complete search history.

(56) References Cited

U.S. PATENT DOCUMENTS 3,949,339 A * 4/1976 Kennedy .............. G01D 5/2258
336/135
4,986,124 A * 1/1991 Byrne ..................... G01D 5/20
257/E27.114
(Continued)

FOREIGN PATENT DOCUMENTS

| CN | 101506620 A | 8/2009 |
| CN | 105164502 A | 12/2015 |
| WO | 2007000653 A1 | 1/2007 |

*Primary Examiner* — Reena Aurora
(74) *Attorney, Agent, or Firm* — Dinsmore & Shohl LLP

(57) ABSTRACT

Embodiments of the present invention are directed to a novel inductive rotational position sensor that includes a sensor module having transmitting and receiving coils formed on a printed circuit board with a signal processor located in a center area enclosed by the transmitting and receiving coils. This arrangement permits a more compact sensor module. The entire sensor module can be positioned inside a cavity, which has a diameter generally the same as the diameter of the rotational element whose position is being sensed. The arrangement also permits a coupler to be formed on the end of the target. The sensor is concentric with the transfer case shaft and an annulus bore of a transfer case. The sensor is non-contacting and has no movable parts.

20 Claims, 7 Drawing Sheets

(51) Int. Cl.
*H01F 27/28* (2006.01)
*H05K 1/16* (2006.01)

(56) References Cited

U.S. PATENT DOCUMENTS

| | | | | |
|---|---|---|---|---|
| 5,323,109 | A | * 6/1994 | Mehnert | G01D 5/2046 |
| | | | | 324/207.17 |
| 6,236,199 | B1 | 5/2001 | Irle et al. | |
| 7,135,855 | B2 | * 11/2006 | Nyce | G01D 5/2216 |
| | | | | 324/207.16 |
| 2008/0007251 | A1 | * 1/2008 | Lee | G01L 3/105 |
| | | | | 324/207.17 |
| 2010/0102803 | A1 | * 4/2010 | Kobayashi | G01D 5/2013 |
| | | | | 324/207.25 |
| 2014/0327432 | A1 | 11/2014 | Elliott et al. | |
| 2015/0160254 | A1 | 6/2015 | Huynh et al. | |
| 2017/0166251 | A1 | 6/2017 | Shao et al. | |

* cited by examiner

INDUCTIVE SENSOR MODULE ASSEMBLY WITH A CENTER SIGNAL PROCESSOR

CROSS-REFERENCE TO RELATED APPLICATIONS

This application claims priority of U.S. Provisional Application 62/548,053 filed Aug. 21, 2017, the contents of which are included herein by reference.

FIELD OF THE INVENTION

This invention relates generally to position sensors. More particularly, this invention relates to inductive position sensors.

BACKGROUND OF THE INVENTION

It is known to provide inductive rotational sensors having transmitter and receiving coils printed on a printed circuit board (PCB). A coupler is generally mounted to a target on a rotating member. The coupler is spaced apart from the coils. The coupler permits eddy currents to be generated in receiving coils, which are proportional to the rotational position of the coupler with respect to the coils. A processor determines a voltage proportional to the eddy currents and then produces as an output signal. The processor is typically provided in an ASIC, which is mounted to the PCB radially outwardly from to the outer circumference of the coils. However, such an arrangement is difficult to use for some packaging requirements.

SUMMARY OF THE INVENTION

In one embodiment of the present invention, an inductive sensor including a sensor module, a signal processor, and a housing is provided. The housing has a first surface and a second surface opposite the first surface. A circular cavity is disposed in the first surface. The circular cavity has a first inner diameter. The sensor module includes a transmitter coil and a receiving coil. The transmitter coil has a second inner diameter and a first outer diameter. The receiving coil and the signal processor are disposed within the second inner diameter of the transmitter coil. The first outer diameter of the transmitter coil is within the first inner diameter of the circular cavity. The sensor module is concentric within the first inner diameter of the circular cavity about a central axis of the circular cavity.

In another embodiment of the present invention, an inductive sensor assembly includes a sensor module, a signal processor, a shaft, and a housing. The shaft has a first outer diameter, a first end and a second end, in which the second end is opposite the first end. A protrusion extends from the first end of the shaft and within the first outer diameter. The housing has a first surface and a second surface opposite the first surface. A circular cavity is disposed in the first surface. The circular cavity has a first inner diameter. A circular wall extending longitudinally from the first surface so to form a circumference around the circular cavity. The circular cavity has a first inner diameter. The sensor module has a transmitter coil and a receiving coil. The transmitter coil has a second inner diameter and a second outer diameter. The receiving coil and the signal processor are disposed within the second inner diameter of the transmitter coil. The first outer diameter of the shaft and the second outer diameter of the transmitter coil are within the first inner diameter of the circular cavity. The shaft and the sensor module are concentric within the first inner diameter of the circular cavity about a central axis of the circular cavity.

In yet another embodiment of the present invention, an inductive sensor assembly includes a housing, a sensor module, a signal processor, a circular cover, a case, and a shaft. The housing has a first surface and a second surface opposite the first surface. A circular cavity is disposed in the first surface. A circular wall extends longitudinally from the first surface so to form a circumference around the circular cavity. The circular cavity has a first inner diameter. The sensor module has a signal processor. The sensor module is disposed within the first inner diameter of the circular cavity. The circular cover has a cylindrical annulus chamber extending longitudinally from a front surface to a rear surface so to form an inner surface and an opposite outer surface. The circular cover is configured to be disposed within the first inner diameter of the circular cavity. The case has a first case surface, a second case surface and an annulus bore. The annulus bore extends along a longitudinal axis. The first case surface has an annular surface portion with respect to the annulus bore. The shaft has a first outer diameter, a first end and a second end, in which the second end is opposite the first end. A semi-circular protrusion extends from the first end of the shaft and is within the first outer diameter. The semi-circular protrusion forms a straight edge coupler. The second end of the shaft is configured to be disposed within the annulus bore of the case. The straight edge coupler of the first end is configured to extend into the cylindrical annulus chamber of the circular cover. The sensor module has a transmitter coil and a receiving coil. The transmitter coil has a second inner diameter and a second outer diameter. The receiving coil has a third outer diameter. The transmitter coil and the receiving coil are arranged coaxially on a circular printed circuit board such that the third outer diameter of the receiving coil is disposed within the second inner diameter of the transmitter coil. The signal processor is disposed within the third outer diameter of the receiving coil. The first outer diameter of the shaft and the second outer diameter of the transmitter coil is within the first inner diameter of the annulus bore. The sensor module, the circular cover, the case, and the shaft are concentric within the first inner diameter of the circular cavity about a central axis of the circular cavity. The second end of the shaft is configured to rotate within the annulus bore and the straight edge coupler rotates within the cylindrical annulus chamber of the circular cover such that the sensor module is configured to sense the straight edge coupler.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION OF THE INVENTION

Embodiments of the present invention are directed to a novel inductive rotational position sensor that includes a sensor module having transmitting and receiving coils formed on a PCB with a signal processor located in a center area enclosed by the transmitting and receiving coils. This arrangement permits a more compact sensor module. The entire sensor module can be positioned inside a cavity, which has a diameter generally the same as the diameter of the rotational element whose position is being sensed. The arrangement also permits a coupler to be formed on the end of the target. The sensor is concentric with the shaft and bore. The sensor is non-contacting and has no movable parts.

Figure 1:
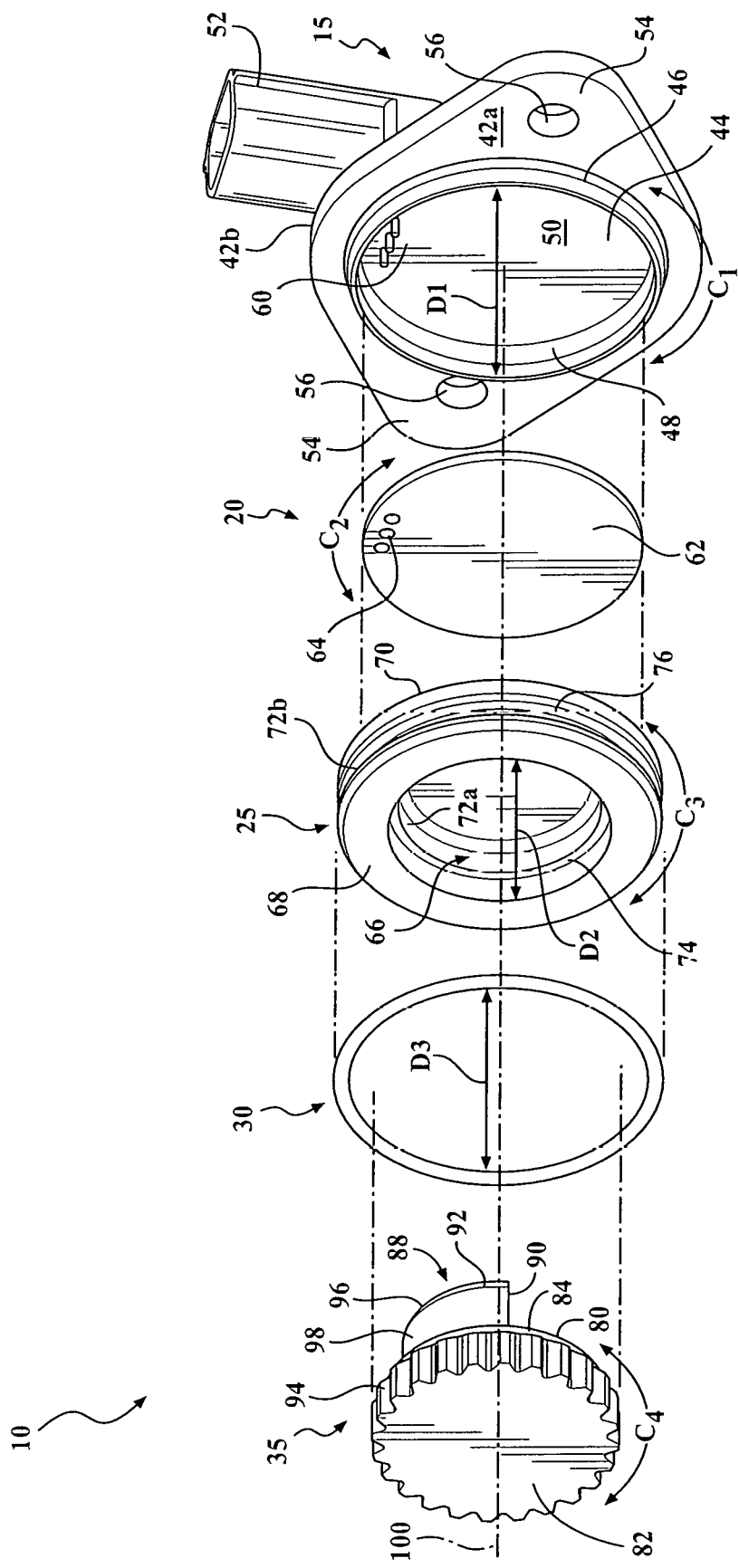
FIG. 1 schematically depicts an exploded view of an inductive sensor assembly according to one or more embodiments shown and described herein.
Figure 2:
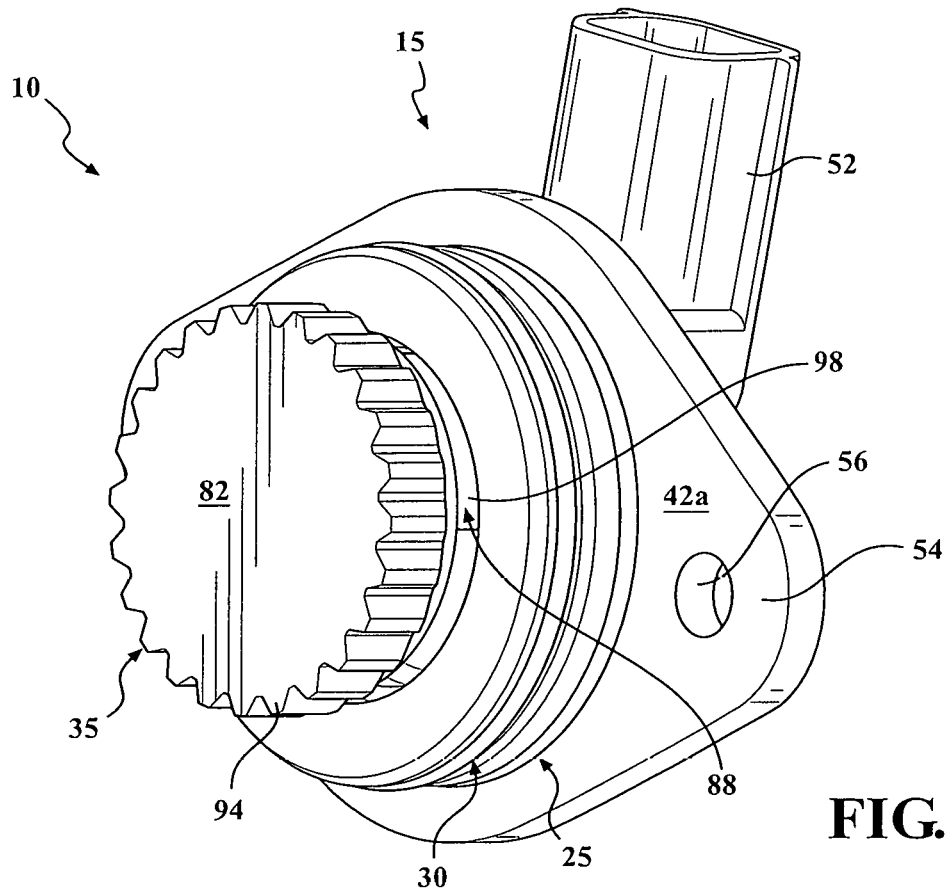
FIG. 2 schematically depicts a top view of the transmitter coil and the receiving coil inductive sensor of FIG. 1 according to one or more embodiments shown and described herein.
Figure 3:
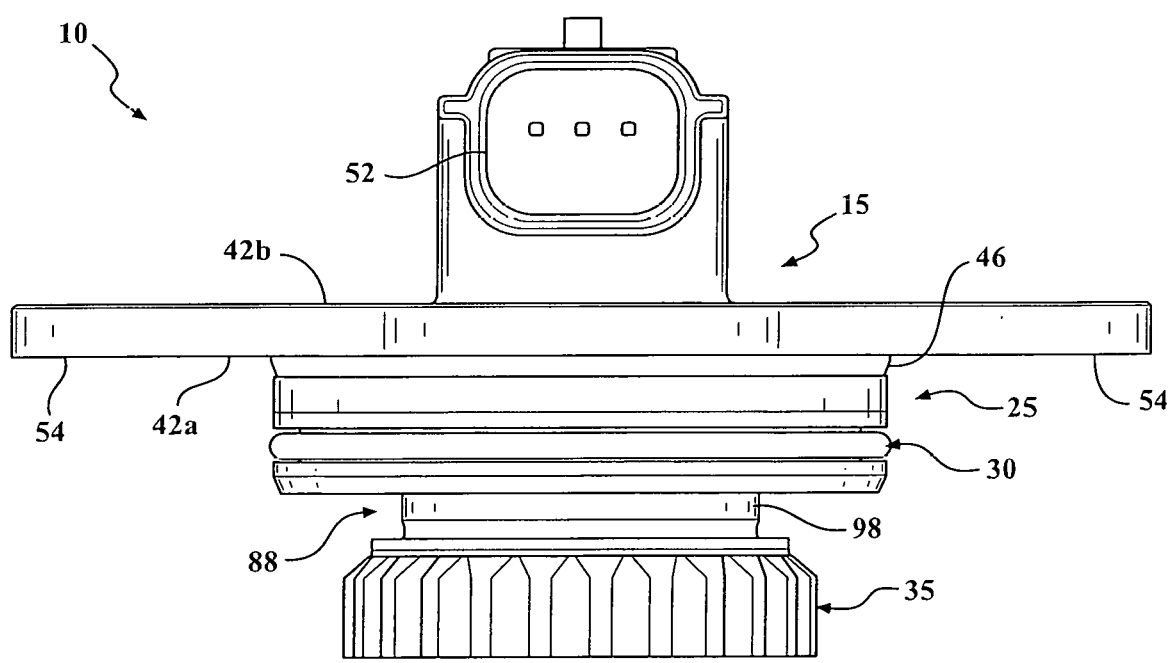
FIG. 3 schematically depicts a top view of the inductive sensor including the signal processor of FIG. 1 according to one or more embodiments shown and described herein.
Figure 4:
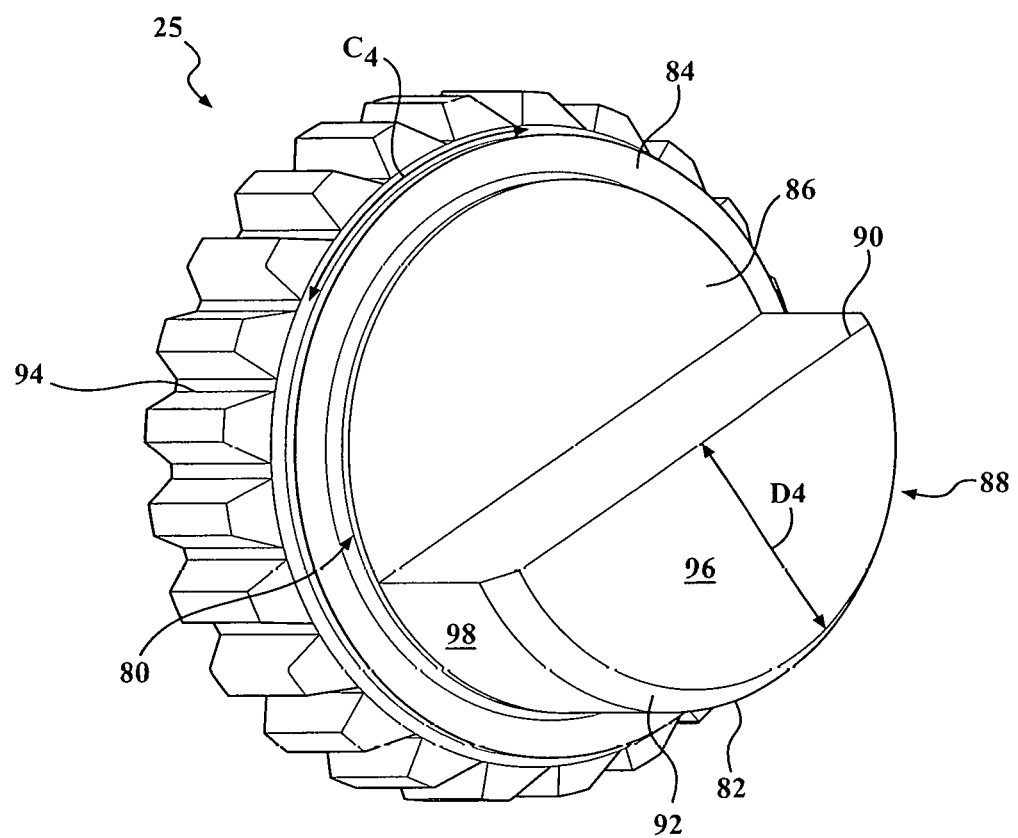
FIG. 4 schematically depicts an isolated top view of the signal processor of FIG. 3 according to one or more embodiments shown and described herein.
Figure 8:
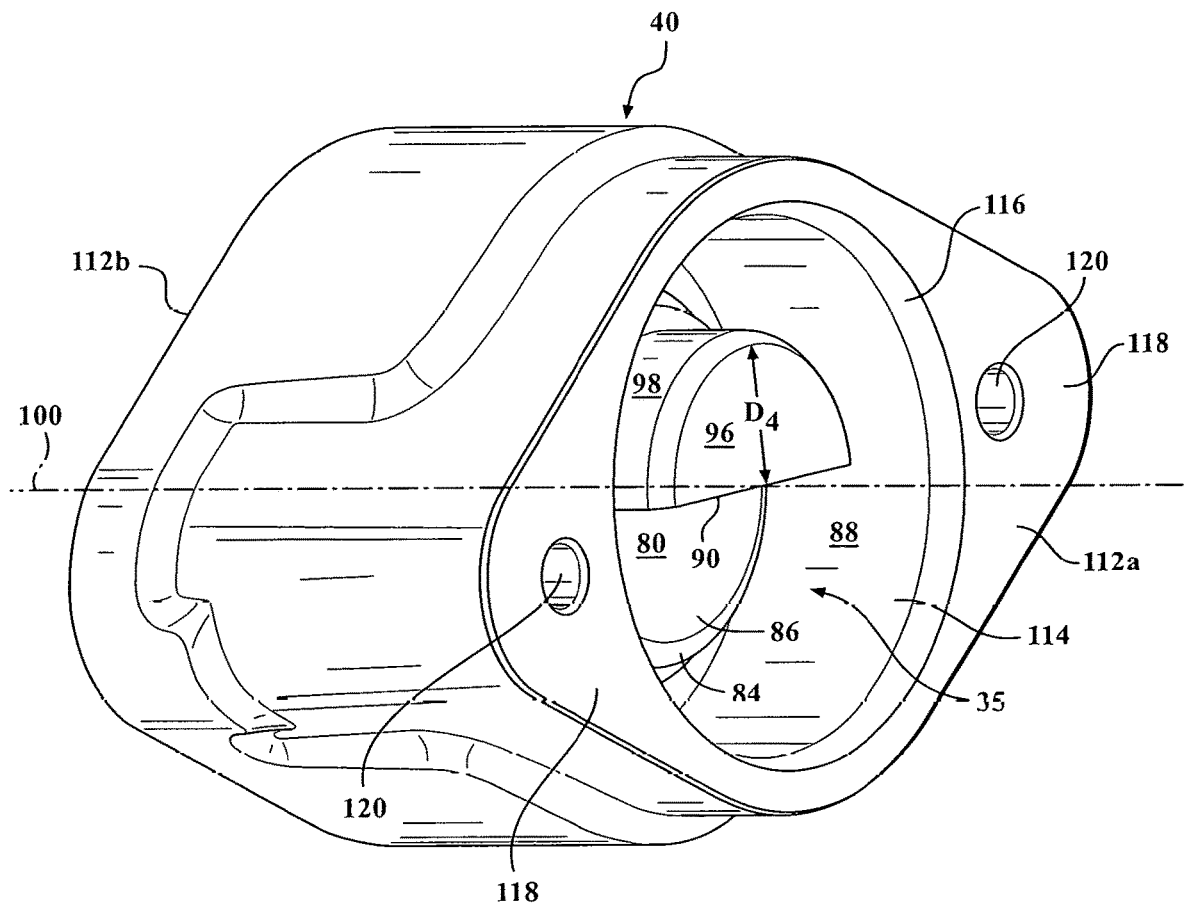
FIG. 8 schematically depicts a perspective view of the inductive sensor assembly illustrating the shaft within the cylindrical transfer case according to one or more embodiments shown and described herein.

Referring now to FIGS. 1-4, where FIG. 1 schematically depicts an exploded view of an inductive sensor assembly 10, FIGS. 2-3 schematically depict assembled views of the inductive sensor assembly 10 and FIG. schematically depicts an isolated view of a shaft 35. The inductive sensor assembly 10 includes a housing 15, a sensor module 20, a circular cover 25, a resilient member 30, the shaft 35, and a case 40 (FIG. 8).

The housing 15 may be an overmold and includes a first surface 42a and a second surface 42b opposite the first surface 42a. A circular cavity 44 is disposed in the first surface 42a. A circular wall 46 extends longitudinally from the first surface 42a so to form an outer diameter or a circumference C1 of the circular cavity 44. The circular cavity 44 has a contiguous circular inner surface 48 so to form a first inner diameter D1 and a rear surface 50. The first surface 42a of the housing 15 includes a pair of ears 54 extending radially outwardly from the circular wall 46. Each ear of the pair of ears 54 has a first aperture 56 configured for a fastener such as, without limitation, a bolt, a screw, a bolt and nut, a nail, a rivet, and/or the like. The housing 15 is also provided with a connector 52 for connecting the output of the sensor module 20 to a remote system. Extending away from the rear surface 50 may be a plurality of electronic pin connectors 60. The plurality of electronic pin connectors 60 may be configured to engage with the sensor module 20, as discussed in greater detail below.

Figure 6:
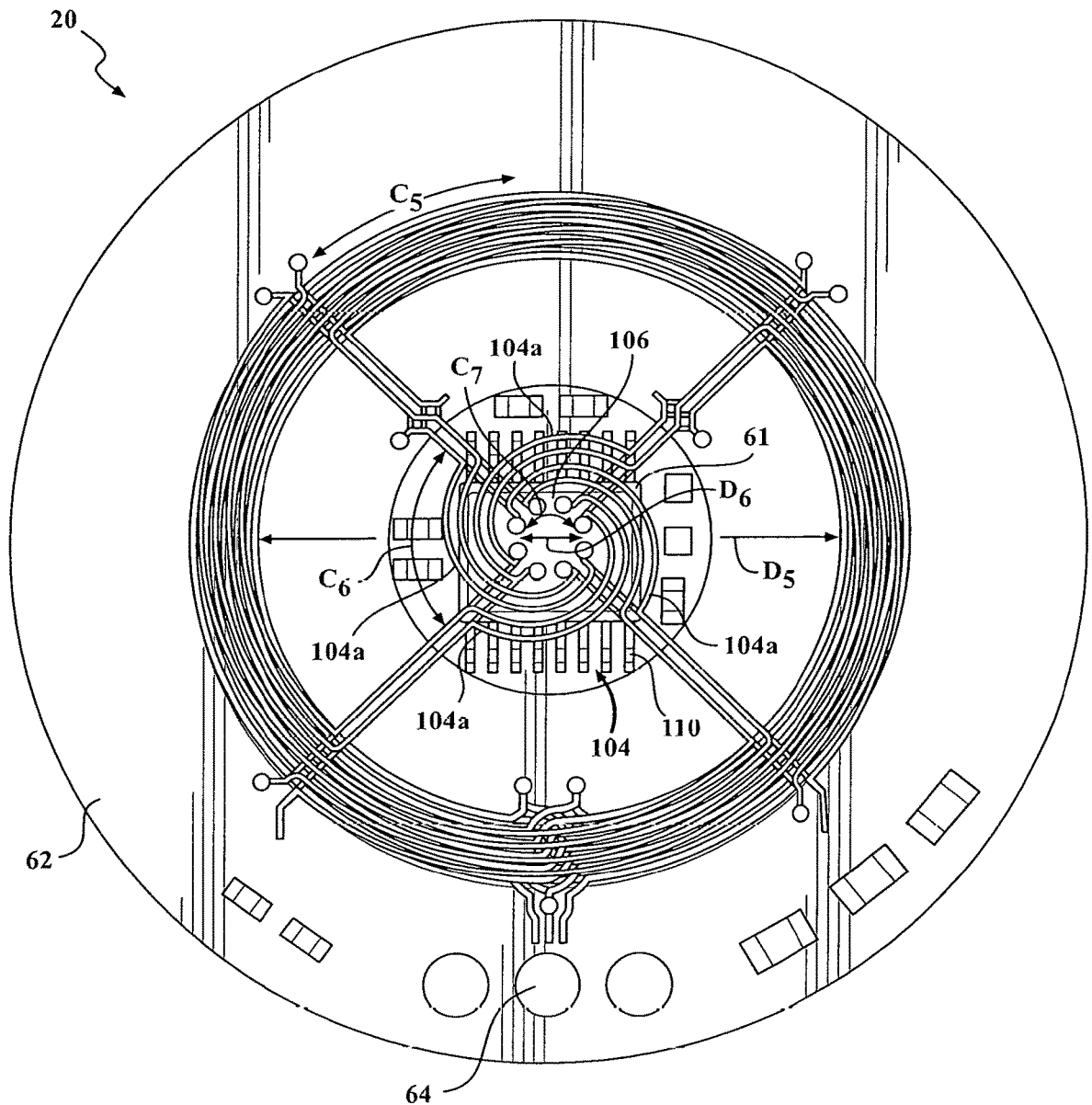
FIG. 6 schematically depicts a perspective view of the inductive sensor assembly of FIG. 1 according to one or more embodiments shown and described herein.

The sensor module 20 has a signal processor 61 (FIG. 6). The sensor module 20 is disposed on a circular printed circuit board (PCB) 62. The circular PCB 62 further includes a plurality of holes 64 adjacent to an outside edge of the circular PCB 62. The plurality of holes 64 may include electrical bonding or tracing configured to interact with the plurality of holes 64 or any electrical object in contact with the plurality of holes 64 such that when the circular PCB 62 is seated against the rear surface 50, the plurality of electronic pin connectors 60 are aligned with and at least make contact with the plurality of holes 64 so that the sensor module 20 is communicatively coupled to the connector 52 of the housing 15. As such, it should be appreciated that a second outer diameter or a second circumference C2 of the circular PCB 62 is substantially similar or less than the inner diameter D1 of the circular cavity 44 such that the circular PCB 62 may be inserted, or seated, within the circular cavity 44. It should also be appreciated that the plurality of electronic pin connectors 60 may extend through the plurality of holes 64 with the circular PCB 62 is seated within the circular cavity 42.

Further, it should be appreciated that the circular PCB 62 may or may not be in contact with the rear surface 50 while in the seated position. Further, it should also be appreciated that while the plurality of electronic pin connectors 60 and the plurality of holes 64 are illustrated as being near the top of the circular cavity 44 and the circular PCB 62 respectfully, this arrangement is for illustrative purposes and the plurality of electronic pin connectors 60 and the plurality of holes 64 may be anywhere in the circular cavity 44 or on the circular PCB 62 respectfully.

The phrase "communicatively coupled" is used herein to describe the interconnectivity of various components of the inductive sensor assembly 10 for sensing a target integrated within an end of shaft within a transfer case environment and means that the components are connected either through wires, optical fibers, or wirelessly such that electrical, optical, and/or electromagnetic signals may be exchanged between the components. It should be understood that other means of connecting the various components of the system not specifically described herein are included without departing from the scope of the present disclosure.

The circular cover 25 has a cylindrical annulus chamber 66 that extends longitudinally from a front surface 68 to a rear surface 70 so to form an inner surface 72a and an opposite outer surface 72b. The inner surface 72a has a second inner diameter D2. The front surface 68 may be a first annular surface. The circular cover 25 is configured to be disposed within the first inner diameter D1 of the circular cavity 44. As such, a third outer diameter or a third circumference C3 of the outer surface 72b may be substantially similar or smaller than the first inner diameter D1 of the circular cavity 44. Further, the rear surface 70 is configured to be adjacent to the circular PCB 62 when the circular cover 25 is seated, at least partially, into the circular cavity 44. As such, in some embodiments, the rear surface 70 of the circular cover 25 may abut, or touch at least a portion of the circular PCB 62. The circular cover 25 may be a spin weld cover.

The inner surface 72a of the circular cover 25 includes a first groove 74. Further, the outer surface 72b of the circular cover 25 includes a second groove 76. The first groove 74 and the second groove 76 are each spaced apart from the front surface 68 and the rear surface 70. Further, the first groove 74 may be circular extending a circumference of the inner surface 72a while the second groove 76 may be circular extending the circumference of the outer surface 72b.

The resilient member 30 may be an O-ring with a third inner diameter D3. The third inner diameter D3 is configured to have a pinch fit engagement with the second groove 76 of the outer surface 72b of the circular cover 25. The resilient member 30 may be composed of any material suitable for sealing the housing 15 radially within the case 40 (FIG. 8) as discussed in greater detail below.

The shaft 35 has a first end 80 and a second end 82. The second end 82 is opposite the first end 80. The second end has a fourth outer diameter or a fourth circumference C4, which is generally larger than the largest circumference of the inductive sensor assembly 10. The first end 80 has a bevel portion 84, which forms a smaller, flat face portion 86 within the first end 80. A protrusion 88 extends from the flat face portion 86 of the first end 80 of the shaft 35. As such, the protrusion 88 is within the fourth outer diameter, or the fourth circumference C4. That is, the protrusion 88 does not extend radially beyond the fourth circumference C4 in any direction. Further, it should be appreciated that the protrusion 88 does not extend beyond the second inner diameter D2 of the circular cover 25, as explained in detail below. The protrusion 88 may be semi-circular in shape having a diameter D4 and forming a straight edge coupler 90, a face portion 96, and a sidewall portion 98, as will be discussed in greater detail herein. As such, from herein, the protrusion may be referred to as a semi-circular protrusion 88 however, the protrusion is not limited to a semi-circular shape. The semi-circular protrusion 88 may have a chamfered edge portion 92. The face portion 96 extends between the chamfered edge portion 92 and the straight edge coupler 90. The face portion 96 is configured to be positioned at a predetermined distance from the sensor module 20, as will be described in greater detail below. A plurality of gears 94 may symmetrically project or extend, in a circular direction, from the second end 82. In some embodiments, the plurality of gears 94 may form at least a portion of the fourth circumference C4. In other embodiments, the fourth circumference is formed by the an edge of shaft 35.

The semi-circular protrusion 88 with the straight edge coupler 90 of the first end 80 are configured to extend into the cylindrical annulus chamber 66 of the circular cover 25. As such, the bevel portion 84 and/or the flat face portion 86 may be in contact with the front surface 68 of the circular cover 25. It should be appreciated that the semi-circular protrusion 88 may extend a predetermined distance into the cylindrical annulus chamber 66, in a longitudinal direction, such that the face portion and the straight edge coupler 90 are a predetermined distance from the rear surface 70 of the circular cover 25.

It should be appreciated that the semi-circular protrusion 88 of the shaft 35 is configured to rotate within the cylindrical annulus chamber 66 of the circular cover 25 such that the sensor module 20 may sense the straight edge coupler 90 of the semi-circular protrusion 88 during the rotation, as will be discussed in greater detail herein. Further, it also should be appreciated that the shaft 35 may be a transfer case shaft. In addition, it should be appreciated that the semi-circular protrusion 88 may include a keyway that is configured to engage with the first groove 74 of the circular cover 25. As such, the keyway would rotate with the shaft 35 within the first groove 74 of the circular cover 25.

It should be appreciated that the sensor module 20, the circular cover 25, the resilient member 30, the shaft 35 and the case 40 (FIG. 8) are concentric within the first inner diameter D1 of the circular cavity 42 about a central axis 100 of the circular cavity 42. Further, it should be appreciated that the shaft 35 may be a transfer case shaft and the case 40 (FIG. 8) may be a transfer case.

Figure 5:
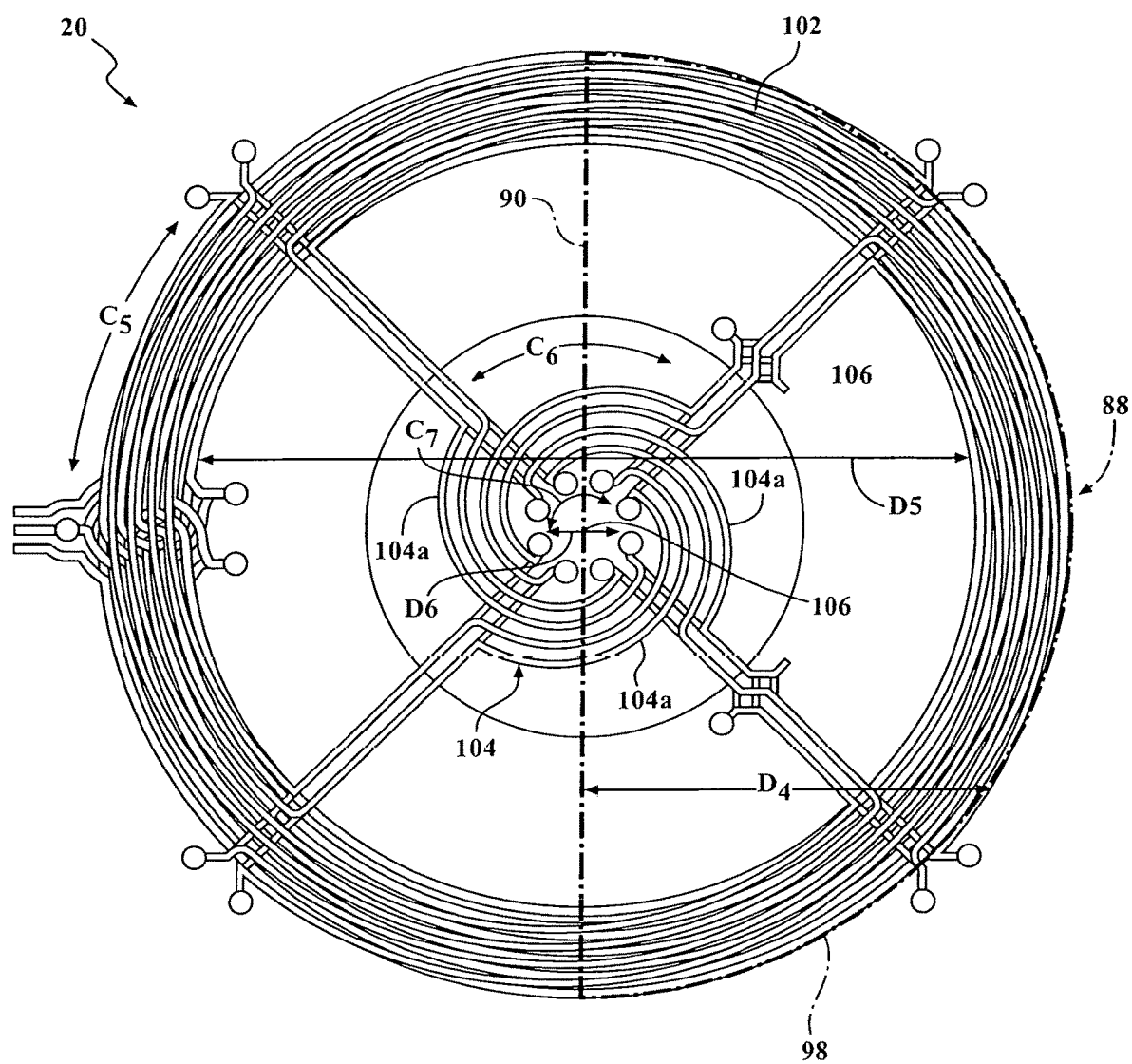
FIG. 5 schematically depicts a perspective view of the shaft of FIG. 1 according to one or more embodiments shown and described herein.
Figure 7:
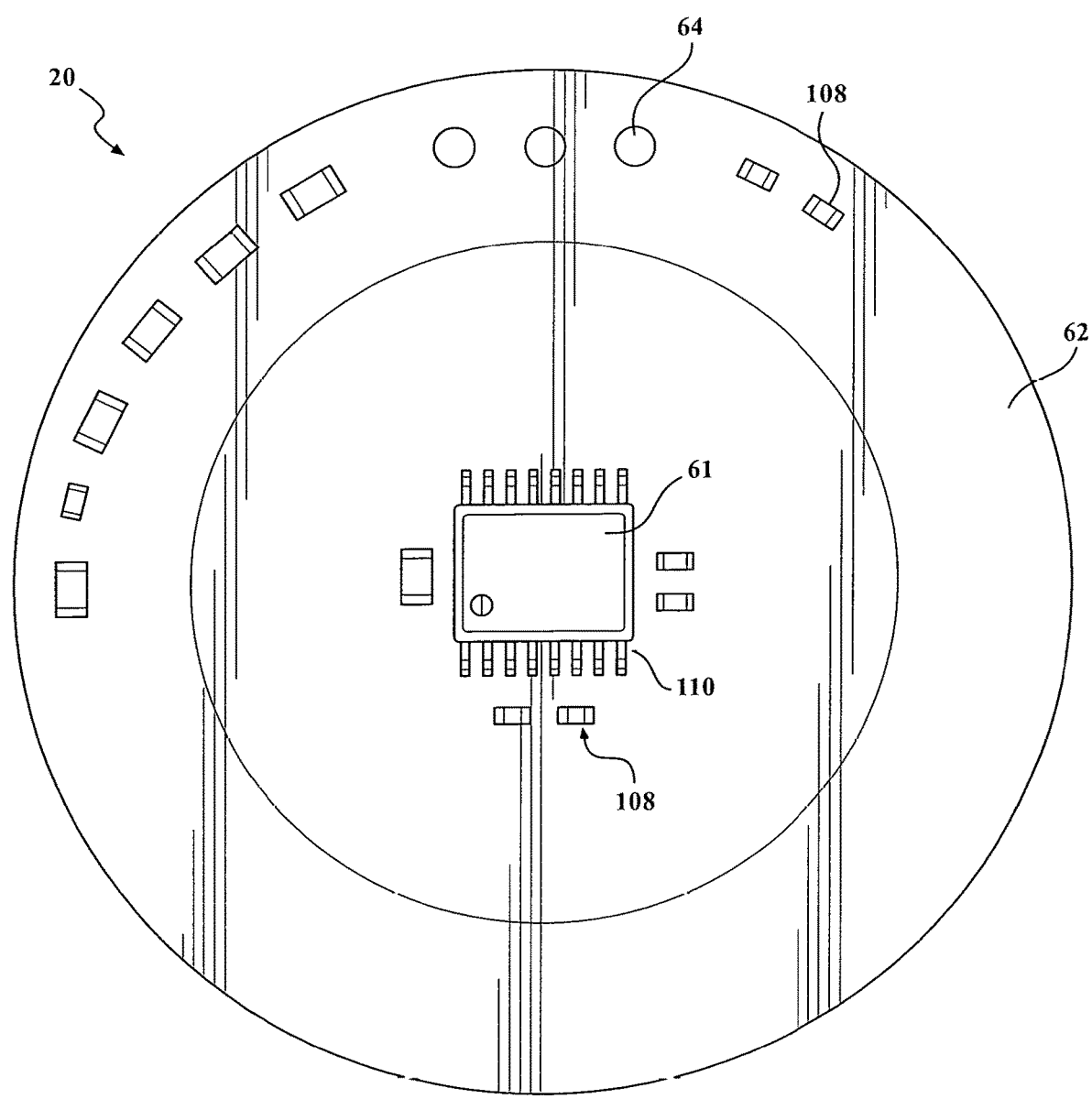
FIG. 7 schematically depicts a front view of the inductive sensor assembly of FIG. 1 according to one or more embodiments shown and described herein.

Now referring to FIGS. 5-7, the sensor module 20 will be described in greater detail. The sensor module 20 includes a transmitter coil 102, a receiving coil 104 and the signal processor 61. The signal processor 61 measures and processes the signals produced and received by the sensor module 20. The signal processor 61 is also connected to a second plurality of pins 110, which transmit the various signals of the sensor module 20. The transmitter coil 102 is generally circular and may include a plurality of windings, which may be adjusted as necessary according to design parameters. The transmitter coil 102 is shown having a circular shape, although other embodiments are possible without departing from the scope of the invention.

The transmitter coil 102 has an inner diameter D5 and an outer diameter or a circumference C5. The receiving coil 104 includes a plurality of coils 104a extending radial outwardly from an outer diameter or circumference C7 at a center point 106. The plurality of coils 104a each extend radially outward and extend about the center point 106 in a continuous arcuate arrangement. The receiving coil 104 is coaxial with reference to a center point 106 so to form an imaginary inner diameter D6 and forms an outer diameter, or a circumference C6. As such, and as best seen in FIGS. 5-6 the receiving coil 104 may be identically offset by a predetermined degrees.

The transmitter coil 102 and the receiving coil 104 are arranged coaxially on the circular PCB 62 such that the sixth circumference C6 of the receiving coil 104 is disposed within the inner diameter D5 of the transmitter coil 102. Further, as best seen in FIG. 6, the signal processor 61 is disposed within the circumference C6 of the receiving coil 104. That is, the signal processor 61 is positioned at the center point 106 so to be at least partially within the arcuate arrangement of the receiving coil 104, As such, this arrangement permits the circular PCB 62 to be inserted within the circular cavity 44 (FIG. 1) as discussed above. That is, the arrangement of the signal processor 61 features a miniaturized design that can be fit into a single package such that this arrangement permits the signal processor 61 to be concentric with the shaft 35 and the circular cavity 44.

Further, it should be appreciated that a plurality of discrete components 108 may be disposed on the circular PCB 62, at least partially outside of the receiving coil circumference C6. These discrete components 108 may include capacitors, resistors, or other basic electronic components known in the art. Further, the circular PCB 62 are used in the fabrication of the sensor module 20, the transmitter coil 102 and the receiving coil 104 are fabricated on PCB as is known to those skilled in the art. Moreover, the transmitter coil 102 and the receiving coil 104 may be fabricated on circuit board. Further, the PCB or the circuit board does not need to be circular and may take other shapes such as, without limitation, square, oval, hexagon, elliptical, and/or the like.

The transmitter coil 102 in the sensor module 20 is energized by an external power source (not shown). The sensor module 20 is configured to measure the rotational position of the straight edge coupler 90 of the semi-circular protrusion 88 of the shaft 35, as best seen in FIG. 5. The straight edge coupler 90 of the semi-circular protrusion 88 acts as a coupler such that the receiving coil 104 is configured to detect and measure the straight edge coupler 90. The signal processor 61 calculates the rotational position of the semi-circular protrusion 88 by comparing the coupling factors between the semi-circular protrusion 88 and the sensor module 20.

As the semi-circular protrusion 88 rotates about the axis of the transmitter coil 102, the portion of the straight edge coupler 90 overlapping the receiving coil 104 changes. This in turn changes the amount of coupling factor between the protrusion and the receiving coil 104. Using the signals measured by the receiving coil 104, the signal processor 61 generates an output signal representative of the rotational position of the shaft 35 relative to the sensor module 20.

Now referring to FIG. 8, a perspective view of the shaft 35 within the case 40 is schematically depicted. The case 40 is generally a cylindrical case configured to be a transfer case. The case 40 has a first case surface 112a, a second case surface 112b and an annulus bore 114 extending along the central or longitudinal axis 100. The first case surface 112a has an annular surface portion 116 with respect to the annulus bore 114. The case 40 includes a pair of flanges 118 extending radially outwardly from the annulus bore 114. Each one of the pair of flanges 118 has a second aperture 120 configured for a fastener, such as, without limitation, the bolt, the screw, the bolt and nut, the nail, the rivet, and/or the like. The pair of ears 54 and the pair of flanges 118 are configured to abut one another such that the first aperture 56 and the second aperture 120 align along the central or longitudinal axis 100 permitting the housing 15 to be mounted to the case 40.

The shaft 35 is housed with the case 40. The second end 82 (FIG. 1) of the shaft 35 is facing towards the second case surface 112b and the first end 80 of the shaft faces the annular surface portion 116. The shaft 35 is rotated by mechanical or electrical power of the transfer case as understood by those skilled in the art. The resilient member 30 (FIG. 1) and the circular cover 25 (FIG. 1) have a pinch fit enragement with the annulus bore 114 when the housing 15 is mounted to the transfer case 40. That is, the resilient member 30 may be in contact with the annulus bore 114 when the circular cover 25 is seated, at least partially, within the case 40. As such, the housing 15 may be sealed in the case 40. Thus, the entire sensor module 20 may be received inside the annulus bore 114 so to allow a radial sealing and access to sense the first end 80 of the shaft 35 without modifying the case 40 and/or without extending the shaft 35.

From the preceding, it can be seen that the present disclosure provides for a concentric sensing module rotary position sensor with the shaft and the annulus bore. Furthermore, the entire PCB and inductive coils fits inside the annulus bore, which permits radial sealing and access to sense the end of the shaft without extending the shaft. Moreover, the sensed target is incorporated into the shaft geometry instead of a separate target attached or mounted to the shaft. This arrangement permits non-contacting sensing where there are not any moving parts in the sensor module.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

We claim:

1. An inductive sensor comprising:
    a sensor module;
    a signal processor; and
    a housing having a cavity;
    the sensor module having a transmitter coil and a receiving coil arranged coaxially with respect to a center point, the transmitter coil having a transmitter coil inner diameter and a transmitter coil outer diameter, the receiving coil having a plurality of coils, each coil of the plurality of coils extends radially outward and extend about the center point in a continuously arcuate arrangement, the receiving coil and the signal processor are disposed within the transmitter coil inner diameter of the transmitter coil, the signal processor is positioned so to be at least partially within the arcuate arrangement of the receiving coil, the transmitter coil outer diameter of the transmitter coil is within the cavity.

2. The inductive sensor of claim 1, wherein the housing has a first surface and an opposite second surface, the cavity disposed in the first surface, the cavity being circular and having a cavity inner diameter.

3. The inductive sensor of claim 2, wherein the sensor module is concentric within the cavity inner diameter of the cavity about a central axis of the cavity.

4. The inductive sensor of claim 1, wherein the transmitter coil and the receiving coil are formed on a printed circuit board.

5. The inductive sensor of claim 4, wherein the printed circuit board is circular, the printed circuit board having a board outer diameter substantially the same as a cavity inner diameter of the cavity.

6. The inductive sensor of claim 4, wherein the transmitter coil and the receiving coil are arranged coaxially on the printed circuit board.

7. The inductive sensor of claim 2, further comprising:
    a circular wall extending longitudinally from the first surface so to form a circumference of the cavity,
    wherein the sensor module is disposed within the cavity.

8. The inductive sensor of claim 1, further comprising:
    the receiving coil having a receiving outer diameter,
    wherein the signal processor is disposed within the receiving outer diameter of the receiving coil.

9. An inductive sensor assembly comprising:
    a sensor module;
    a signal processor;
    a member having a member outer diameter, a first end and a second end, the second end is opposite the first end, a protrusion extending from the first end of the member and within the member outer diameter; and
    a housing having a cavity, the cavity having a cavity inner diameter;
    the sensor module having a transmitter coil and a receiving coil arranged coaxially with respect to a center point, the transmitter coil having a transmitter coil inner diameter and a transmitter coil outer diameter, the receiving coil having a plurality of coils, each coil of the plurality of coils extends radially outward and extend about the center point in a continuously arcuate arrangement;
    the receiving coil and the signal processor are disposed within the transmitter coil inner diameter of the transmitter coil, the member outer diameter of the member and the transmitter coil outer diameter of the transmitter coil is less than the cavity inner diameter of the cavity such that the first end of the member, the sensor module and the signal processor are all positioned within the cavity of the housing, wherein the first end of the member moves within the cavity such that the sensor module senses the movement of the protrusion extending from the first end of the member within the cavity.

10. The inductive sensor assembly of claim 9, wherein:
the housing has a first surface and an opposite second surface,
the cavity being circular is disposed in the first surface, a circular wall extending longitudinally from the first surface, and
the circular wall forms a circumference around the cavity.

11. The inductive sensor assembly of claim 9, wherein the member and the sensor module are concentric within the cavity inner diameter of the cavity about a central axis of the cavity.

12. The inductive sensor assembly of claim 9, wherein the member is configured to rotate the protrusion.

13. The inductive sensor assembly of claim 9, wherein the protrusion is semi-circular forming a straight edge coupler.

14. The inductive sensor assembly of claim 13, wherein the sensor module is configured to sense the straight edge coupler.

15. The inductive sensor assembly of claim 10, wherein:
the transmitter coil and the receiving coil are formed on a printed circuit board,
the transmitter coil and the receiving coil are arranged coaxially on the printed circuit board, and
the printed circuit board having a board circumference substantially the same as the cavity inner diameter of the cavity such that the sensor module and at least a portion of the protrusion of the member are disposed within the cavity inner diameter of the cavity.

16. The inductive sensor assembly of claim 9, wherein the receiving coil having a receiving coil outer diameter positioned within the transmitter coil inner diameter,
wherein the signal processor is positioned so to be at least partially within the arcuate arrangement of the receiving coil.

17. The inductive sensor assembly of claim 10, further comprising:
a circular cover having a cylindrical annulus chamber extending longitudinally from a front surface to a rear surface so to form an inner surface and an opposite outer surface, the circular cover configured to be disposed within the cavity inner diameter of the cavity; and
a case having a first case surface, a second case surface and an opening, the opening extending along a longitudinal axis, the first case surface having an annular surface portion with respect to the opening.

18. The inductive sensor assembly of claim 17, wherein:
the first surface of the housing has a pair of ears, each ear having a first aperture,
the first case surface of the case having a pair of flanges, each flange having a second aperture, and
the pair of flanges and the pair of ears are configured to abut one another,
wherein the first aperture and the second aperture are aligned for a fastener to couple the housing to the case.

19. The inductive sensor assembly of claim 17, wherein the sensor module, the circular cover, the case, and the member are concentric within the cavity inner diameter of the cavity about a central axis of the cavity.

20. The inductive sensor assembly of claim 17, wherein the case is a transfer case and the member is a transfer case shaft.

* * * * *